United States Patent
Wang et al.

[11] Patent Number: 5,977,549
[45] Date of Patent: Nov. 2, 1999

[54] APPARATUS AND METHOD OF PRODUCING DUAL ION/ELECTRON SOURCE

[75] Inventors: Yuh-Lin Wang, Taipei; Lung-Wen Chen, Taichung Hsien, both of Taiwan

[73] Assignee: United Microelectronics Corp, Hsin-Chu, Taiwan

[21] Appl. No.: 09/074,866

[22] Filed: May 8, 1998

[30] Foreign Application Priority Data

Feb. 9, 1998 [TW] Taiwan ................................. 87101687

[51] Int. Cl.⁶ ................................................. H01J 37/26
[52] U.S. Cl. .................. 250/423 R; 250/424; 250/423 F
[58] Field of Search ............................... 250/423 R, 424, 250/425, 423 F

[56] References Cited

U.S. PATENT DOCUMENTS

| | | | |
|---|---|---|---|
| 4,617,203 | 10/1986 | Jergenson | 427/294 |
| 4,638,217 | 1/1987 | Okubo et al. | 250/423 R |
| 4,740,698 | 4/1988 | Tamura et al. | 250/310 |
| 4,835,399 | 5/1989 | Hosaka et al. | 250/492.2 |

*Primary Examiner*—Kiet T. Nguyen
*Attorney, Agent, or Firm*—Jiawei Huang; J. C. Patents

[57] ABSTRACT

An apparatus and a method of producing a dual ion/electron source. The ion beam and the electron beam are produced by a charged particle optical system. Using an ion source metal to emit an ion beam or an electron beam. The direction of the ion beam and the electron beam is identical. Neither the particle source nor the sample need to be rotated or shifted.

21 Claims, 3 Drawing Sheets

APPARATUS AND METHOD OF PRODUCING DUAL ION/ELECTRON SOURCE

CROSS-REFERENCE TO RELATED APPLICATION

This application claims priority benefit of Taiwan application Serial no. 87101687, filed Feb. 9, 1998, the full disclosure of which is incorporated herein by reference.

BACKGROUND OF THE INVENTION

1. Field of the Invention

The invention relates to an apparatus and a method of producing a focused ion beam (FIB) and a focused electron beam (FEB), and more particularly to an apparatus and a method of extracting both ion and electron beams from a liquid metal ion source (LIMS).

2. Description of the Related Art

The technique of FIB has been applied broadly in inspecting and mending integrated circuits (ICs) to achieve the objects of improving yield and enhancing throughput. Recently, a FIB produced by an LMIS has not only been applied in scanning ion microscopy (SIM), high spatial resolution secondary ion mass spectrometry (SIMS), but also in semiconductor fabrication process, for example, selective area molecular beam epitaxy, beam-induced selective area material deposition or etching, photolithographic mask repair, and sample preparation for transmission electron microscopy (TEM).

Inspection of a microstructure is conducted by a FIB-based microlithography and a microanalytic process. In principle, such inspection can be achieved by operating FIB as a SIM, which is similar to scanning electron microscopy (SEM). The main difference between SIM and SEM is that a SEM scans a FEB across the sample surface to achieve microscopic imaging, while a SIM scans a FIB. Due to the very large momentum of ion beam, a FIB is highly destructive. Material scanned by FIB is continuously sputter-removed from a sample surface during a SIM observation. Thus, details of a microstructure could have been eroded away quickly before a meaningful measurement is made. The less destructive SEM is therefore preferred in the application of inspection, and the SIM is preferred in the application of microsurgical operation.

A conventional dual beam system comprising two independent optical columns is shown as FIG. 1. In the figure, a FEB 10' is produced by an optical column 10, and a FIB 12' is produced by the optical column 12. Both the FEB 10' and the FIB12' are pointed exactly on the same spot of the sample 14, so that an identical area of the sample 14 is observed by both FEB 10' and FIB 12'. A detector 16 is positioned aside of the optical column 12 for detecting signal.

The cost of the above dual beam system is twice of a single column system. The disadvantage in application is that to have the FEB 10' and the FIB 12' incident on a same spot of the sample 14, the sample 14 has to be rotated with an angle of θ for FEB 10' operation. A displacement is inevitably caused during rotation. Therefore, loss of precise registration is resulted. During the subsequent process such as high precision optical cutting or material deposition, the accuracy is decreased.

If the loss of precise registration is overcome, the images obtained by FEB and the FIB are still different. It is because that only one detector is in use. The sample has been rotated, so that the prospectives of the images are different. While positioning FIB, systematic mistakes happen.

Thus, the development of a single optical column with both FIB and FEB are necessary. In U.S. Pat. No. 4,740,698, a focused ion/electron beam (FIEB) system is disclosed. An LIMS and a separate field emission electron source (FEES) mounted on a changeover gadget are employed to switch between FIB and FEB. The drawback of the two-tip system is in the displacement of source position. Such displacement leads to a relative shift between the FIB and the FEB images. The operation of FIB is complicated. In addition, once the tip of the FEB is damaged, it can not be repaired.

SUMMARY OF THE INVENTION

It is therefore an object of the invention to provide an apparatus of producing a dual ion/electron source. The apparatus comprises a single optical column with a single tip to produce both FIEB.

It is therefore another object of the invention to provide an apparatus of producing a dual ion/electron source. The tip of electron source is formed by condensed liquid metal. Even if the tip is damage during operation, it can be repaired and renewed.

It is therefore a further object of the invention to provide a method of producing a dual ion/electron source. A FIB and a FEB can be obtained and switched from the same point source. The emission mode can be switched between the FIB and the FEB by a cooling or a melting process and changing the polarity of applied voltage.

To achieve these objects and advantages, and in accordance with the purpose of the invention, as embodied and broadly described herein, the invention is directed towards an apparatus of producing a dual ion/electron source. Either an ion beam or an electron beam is selected to emit in a same direction. The apparatus comprises a metal reservoir, containing a metal; a metal tip, connected with the metal reservoir and emitting the ion beam and the electron beam; a heater, coupled to the metal reservoir to heat the metal to produce the ion beam and the electron beam; an extraction electrode, to extract the ion beam and the electron beam; a voltage supply system, comprising an ion/electron beam voltage supply coupled to the metal supplying apparatus to provide a stable voltage, so that the ion beam or the electron beam is produced, and an extracting voltage supply coupled to the extraction electrode to provide an extracting voltage, so that the ion beam or the electron beam is produced; and a heating current supply, coupled to the heater in the metal supply apparatus to melt a metal in the metal reservoir by providing a heating current.

To achieve these objects and advantages, and in accordance with the purpose of the invention, as embodied and broadly described herein, the invention is directed towards a method of producing a dual ion/electron source. A metal supply apparatus comprising a metal tip, a heater, and a metal reservoir to provide an electron beam and an ion beam emitted from the metal tip, is provided. An extraction electrode is provided. A voltage supply system is provided. The voltage supply comprises an ion/electron voltage supply coupled to the metal supply apparatus, so that the ion beam or the electron beam is produced by providing a stable voltage, and an extracting voltage supply coupled to the extraction electrode, so that the ion beam or the electron beam is produced by providing an extracting voltage. A heating current supply is provided to produce a heating current to the heater. The metal in the metal reservoir is melted by applying the heating current. A negative extracting voltage is provided to produce a stable ion beam. The heating current is turned off, and the negative extracting voltage is kept provided, so that the metal is quenched, and a thin film is formed on a surface of the metal tip by the solidified metal. A positive extracting voltage is supplied to produce an electron beam.

It is to be understood that both the foregoing general description and the following detailed description are exemplary and explanatory only and are not restrictive of the invention as claimed.

BRIEF DESCRIPTION OF THE DRAWINGS

FIG. 2b shows an enlarged view of a part of the metal supply apparatus shown in FIG. 2a.

DESCRIPTION OF THE PREFERRED EMBODIMENTS

Figure 1:
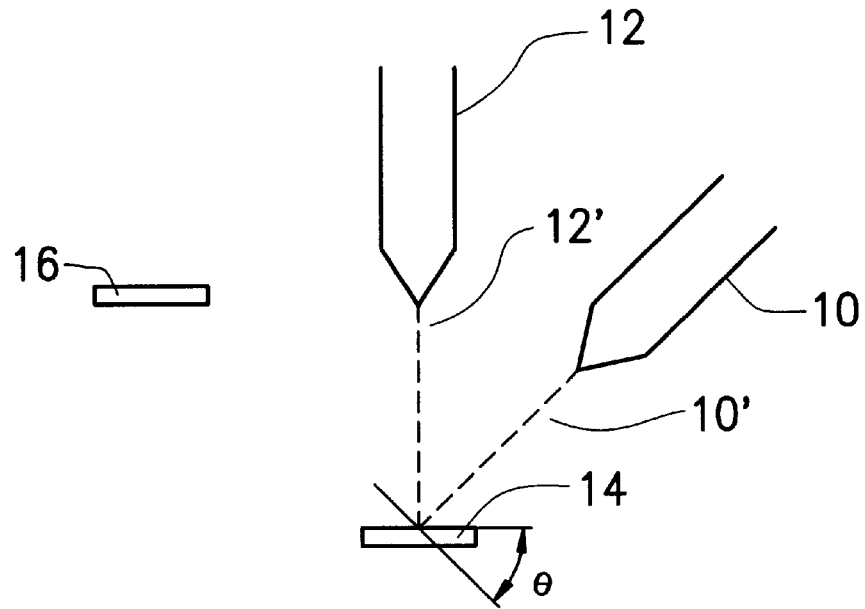
FIG. 1 is a conventional system with two optical columns.
Figure 2A:
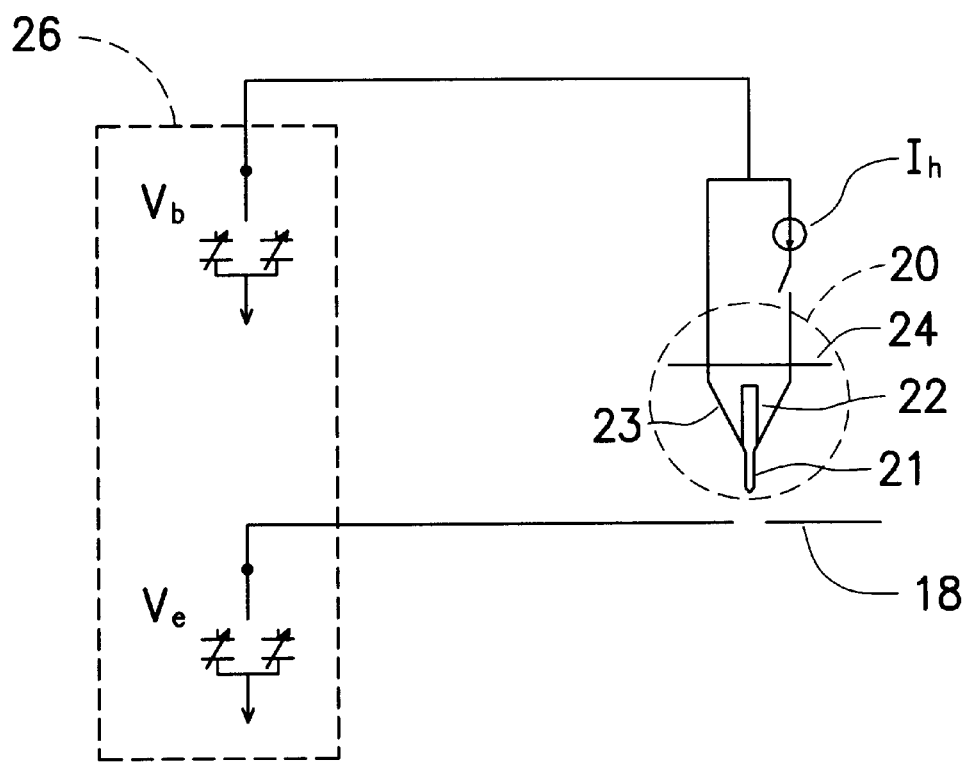
FIG. 2a shows a metal supply apparatus in a preferred embodiment according to the invention.
Figure 2B:
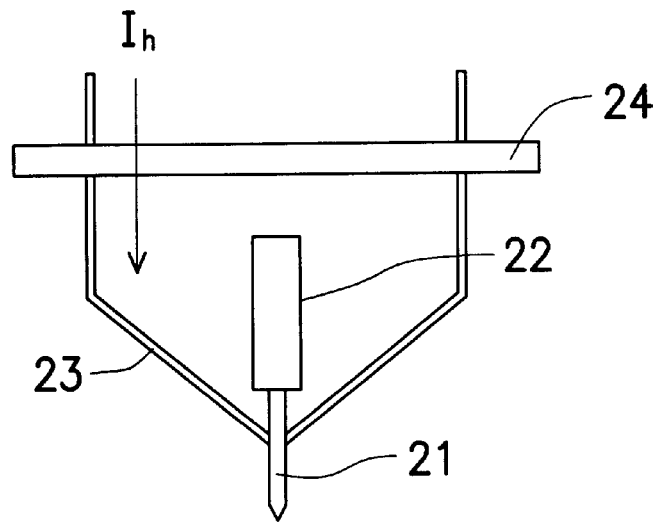

In FIG. 2a and FIG. 2b, a typical metal supply apparatus is shown. An apparatus for producing an FIEB comprises an extraction electrode 18 and a metal supplying apparatus 20. The metal supplying apparatus 20 further comprises a sharp metal tip 21, a metal reservoir 22, a heater 23 and an insulation frame 24. A metal thin film is coated on the surface of the metal tip 21 as the ion-source metal. The metal supplying apparatus 20 is connected with a voltage supply system 26. The voltage supply system 26 comprises a dual polarity high voltage power supply which provides an ion/electron beam energy Vb, and another dual polarity high voltage power supply which provides an extracting voltage Ve. In addition, the ion source is connected with a heater current supply which provides a heating current Ih.

Figure 3:
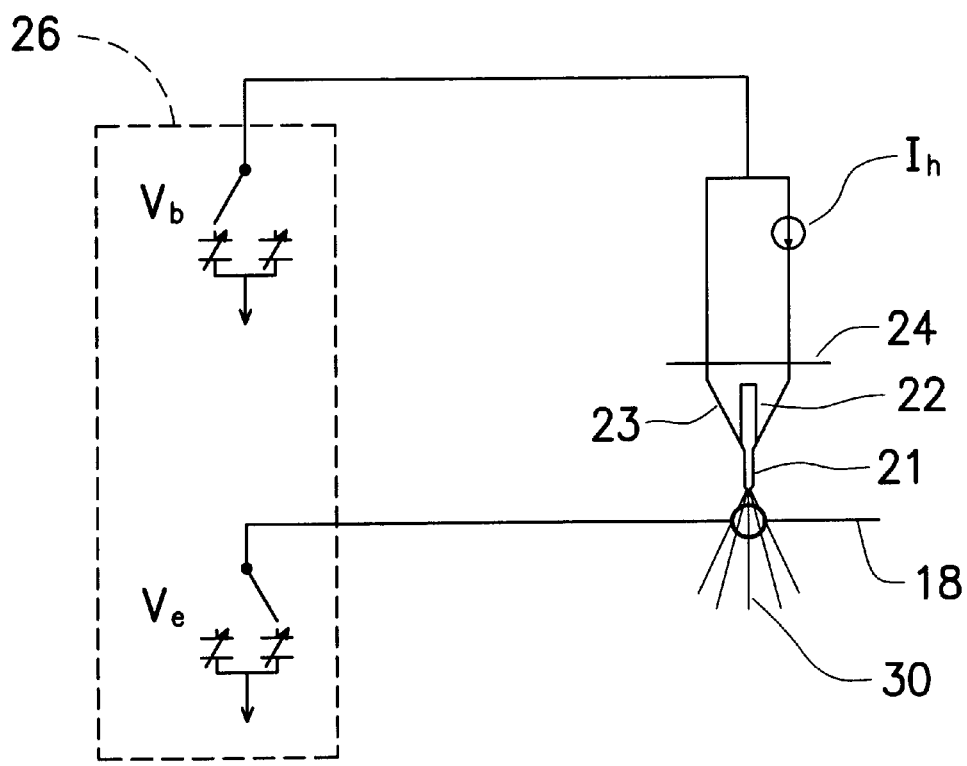
FIG. 3 to FIG. 5 show a switching operation of a dual ion/electron source in a preferred embodiment according to the invention.

In FIG. 3, operation of ion emission mode is shown. The metal in the metal reservoir 22 is melted as an ion supply source by applying enough heating current. The heating current Ih and the negative extracting voltage Ve opposite to the ion/electron beam energy Vb are adjusted to obtain a stable ion emission 30.

Figure 4:
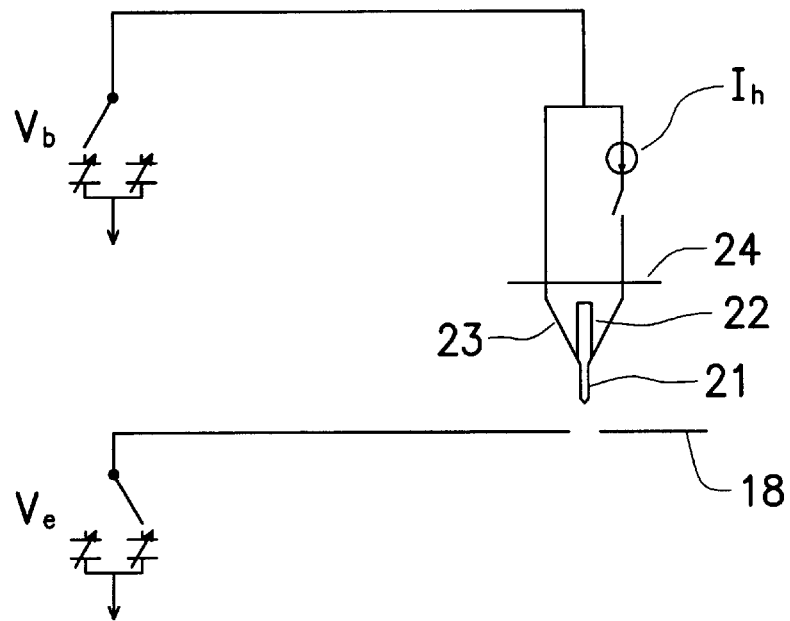

Referring to FIG. 4, to transform ion-source metal to an emitter of electron emission, a stable ion emission is required. The heating current is turned off to quench the metal tip 21. The extracting voltage Ve is kept constant. The ion emission does not terminate until the ion source metal is solidified. After the solidification of the ion source metal, the thin film on the surface of the metal tip 21 becomes sharp.

Figure 5:
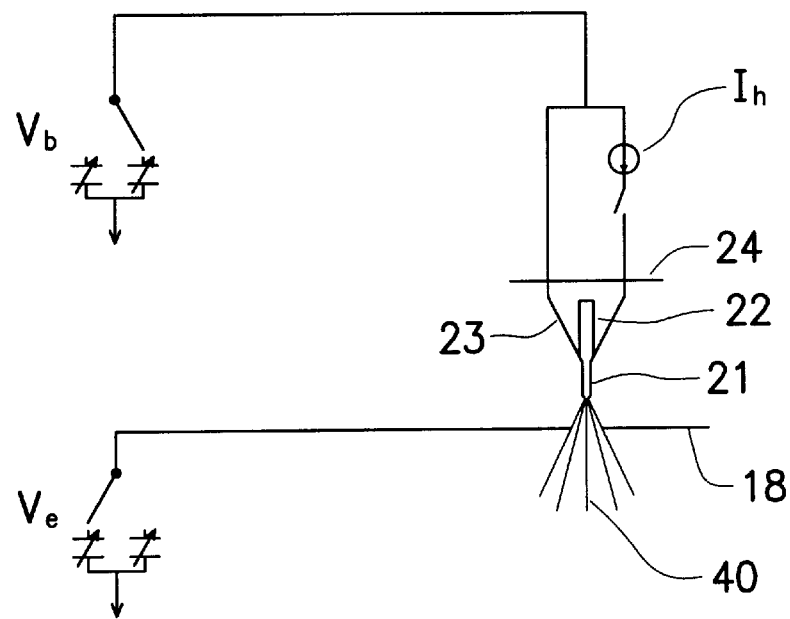

Referring to FIG. 5, by supplying a positive extracting voltage Ve to the extraction electrode 18, electron emission is produced. In the electron emission mode, the emission characteristics and the stability of electron beam depend on the quenching condition of the metal tip 21.

Provided that the ion source metal in the metal reservoir 22 is not run out, the above procedure can be repeated unlimitedly. The ion beam for FIB operation is produced first. The observation by FEB is then performed. In case that the characteristics of electron emission are degraded during FEB observation, the system can be switched back to the ion emission mode. The metal on the metal tip is renewed, and the system can be switched to the electron emission mode again.

In the invention, the metal used in the metal supply apparatus is, for example, a pure metal element or an alloy.

A new technique is used to fabricate a tip as the field induced electron emitter. That is, by quenching ion source metal during ion emission, the ion source metal is transformed as an electron emitter. The tip has a low surface work function and a high surface reactivity. In addition, ion beam and electron beam are incident in a same direction, the sample to be measured and inspected does not need to be rotated.

One of the characteristics of the invention is that an ion beam or an electron beam is selected to emit in the same system with one single point source. The design of the system is simplified and the cost of the apparatus is reduced.

Another characteristic of the invention is that while selecting ion emission or electron emission, a quenching or melting procedure is performed, and the polarity of the voltage source is changed to switch the emission mode. The operation is easy. The complexity of the system is simplified.

The other characteristic of the invention is that the electron source tip is formed by the solidified liquid metal. If the tip is damaged or destroyed in use, it can be renewed by quenching and solidification.

Other embodiment of the invention will appear to those skilled in the art from consideration of the specification and practice of the invention disclosed herein. It is intended that the specification and examples considered as exemplary only, with the true scope and spirit of the invention being indicated by the following claims.

What is claimed is:

1. An apparatus of producing a dual ion/electron source, wherein either an ion beam or an electron beam is selected to emit in a same direction, comprising:
    a metal supplying apparatus, comprising a heater, a metal tip and a metal reservoir to produce the ion beam and the electron beam emitting from the metal tip;
    a metal thin film, coated on the metal tip, and being melted while producing the ion beam and being solidified while producing the electron beam;
    an extraction electrode, to extract the ion beam and the electron beam;
    a voltage supply system, comprising an ion/electron beam voltage supply coupled to the metal supply apparatus to provide a stable voltage, so that the ion beam or the electron beam is produced, and an extracting voltage supply coupled to the extraction electrode to provide an extracting voltage, so that the ion beam or the electron beam is extracted; and
    a heating current supply, coupled to the heater in the metal supply apparatus to melt a metal in the metal reservoir by providing a heating current.

2. The apparatus according to claim 1, wherein the metal thin film is made from the metal contained in the metal reservoir.

3. The apparatus according to claim 1, wherein the metal includes a pure metal element.

4. The apparatus according to claim 1, wherein the metal includes an alloy.

5. The apparatus according to claim 1, wherein the extracting voltage supply includes a dual polarity high voltage supply.

6. The apparatus according to claim 5, wherein an ion beam is obtained while a negative extracting voltage is provided by the extracting voltage supply.

7. The apparatus according to claim 5, wherein an electron beam is obtained while a positive extracting voltage is provided by the extracting voltage supply.

8. The apparatus according to claim 1, wherein the ion/electron beam voltage supply includes a dual polarity high voltage supply.

9. An apparatus of producing a dual ion/electron source, wherein either an ion beam or an electron beam is selected to emit in a same direction, comprising:

a metal supplying apparatus comprising:
- a metal reservoir, containing a metal;
- a metal tip, connected with the metal reservoir and emitting the ion beam and the electron beam;
- a metal thin film, coated on the metal tip, and being melted while the metal tip is emitting the ion beam and being solidified while the metal tip is emitting the electron beam;
- a heater, coupled to the metal reservoir for heating the metal;

an extraction electrode, to extract the ion beam and the electron beam;

a voltage supply system, comprising an ion/electron beam voltage supply coupled to the metal supplying apparatus provide a stable voltage, so that the ion beam or the electron beam is produced, and an extracting voltage supply coupled to the extraction electrode to provide an extracting voltage, so that the ion beam or the electron beam is extracted; and a heating current supply, coupled to the heater in the metal supply apparatus to melt the metal in the metal reservoir by providing a heating current.

10. The apparatus according to claim 9, wherein the metal thin film is made from the metal contained in the metal reservoir.

11. The apparatus according to claim 9, wherein the metal includes a pure metal element.

12. The apparatus according to claim 9, wherein the metal includes an alloy.

13. The apparatus according to claim 9, wherein the extracting voltage supply includes a dual polarity high voltage supply.

14. The apparatus according to claim 13, wherein an ion beam is obtained while a negative extracting voltage is provided by the extracting voltage supply.

15. The apparatus according to claim 13, wherein an electron beam is obtained while a positive extracting voltage is provided by the extracting voltage supply.

16. The apparatus according to claim 9, wherein the ion/electron beam voltage supply includes a dual polarity high voltage supply.

17. A method of producing a dual ion/electron beam source, comprising:

providing a metal supply apparatus, comprising a metal tip of which a surface is coated with a metal thin film, a heater and a metal reservoir;

heating the metal tip and the metal reservoir by the heater, so that the metal thin film and a metal contained in the metal reservoir are melted;

providing an extracting voltage with a first polarity and an ion/electron beam energy of a stable voltage with a second polarity opposite to the first polarity to obtain an ion beam;

stopping heating the metal tip and the metal reservoir to solidify the metal thin film; and switching the extracting voltage to have the second polarity while the metal tip and the metal reservoir are solidified, so as to obtain an electron beam.

18. The method according to claim 17, wherein the metal includes a pure metal element.

19. The method according to claim 17, wherein the metal includes an alloy.

20. The method according to claim 17, wherein the ion/electron beam voltage is supplied by an ion/electron beam voltage supply which includes a dual polarity high voltage supply.

21. The method according to claim 17, wherein the extracting voltage is supplied by an extracting voltage supply which includes a dual polarity high voltage supply.

* * * * *